(12) United States Patent
Yamamoto et al.

(10) Patent No.: US 11,842,881 B2
(45) Date of Patent: Dec. 12, 2023

(54) MEASUREMENT DEVICE AND SIGNAL PROCESSING METHOD

(71) Applicant: Hitachi High-Tech Corporation, Tokyo (JP)

(72) Inventors: Akio Yamamoto, Tokyo (JP); Kazuki Ikeda, Tokyo (JP); Wen Li, Tokyo (JP); Shunsuke Mizutani, Tokyo (JP); Hiroyuki Takahashi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 124 days.

(21) Appl. No.: 17/413,011

(22) PCT Filed: Dec. 18, 2018

(86) PCT No.: PCT/JP2018/046514
§ 371 (c)(1),
(2) Date: Jun. 11, 2021

(87) PCT Pub. No.: WO2020/129150
PCT Pub. Date: Jun. 25, 2020

(65) Prior Publication Data
US 2022/0068597 A1 Mar. 3, 2022

(51) Int. Cl.
*H01J 37/28* (2006.01)
*H01J 37/244* (2006.01)

(52) U.S. Cl.
CPC ........... *H01J 37/28* (2013.01); *H01J 37/244* (2013.01); *H01J 2237/24495* (2013.01); *H01J 2237/281* (2013.01)

(58) Field of Classification Search
CPC ............. H01J 37/28; H01J 37/244; H01J 2237/24495; H01J 2237/281; H01J 2237/2443
See application file for complete search history.

(56) References Cited

U.S. PATENT DOCUMENTS 6,960,771 B1 11/2005 Suyama et al.
8,859,951 B2 * 10/2014 Wang .................... H04N 1/407
250/252.1

(Continued)

FOREIGN PATENT DOCUMENTS

JP   2000275102 A   10/2000
JP   2011175811 A    9/2011

(Continued)

OTHER PUBLICATIONS

Search Report dated Mar. 19, 2019 in corresponding International Application No. PCT/JP2018/046514.

(Continued)

*Primary Examiner* — David A Vanore
(74) *Attorney, Agent, or Firm* — Miles & Stockbridge, P.C.

(57) ABSTRACT

A measurement device that comprises a photoelectric conversion element and a signal processing part that receives, from the photoelectric conversion element, detected pulses that include dark pulses and signal pulses that are outputted in accordance with inputted photons. The signal processing part performs amplitude discrimination on the detected pulses on the basis of a pre-acquired dark pulse amplitude distribution for the photoelectric conversion element.

4 Claims, 6 Drawing Sheets

(56) References Cited

U.S. PATENT DOCUMENTS

| | | | |
|---|---|---|---|
| 9,835,735 B2* | 12/2017 | Preston | G01T 1/02 |
| 10,451,748 B1* | 10/2019 | Qiang | G01T 1/2018 |
| 2012/0025074 A1 | 2/2012 | Barbi et al. | |
| 2014/0110573 A1* | 4/2014 | Wang | H04N 1/407 |
| | | | 250/252.1 |
| 2016/0219234 A1* | 7/2016 | Nishihara | H01L 27/14609 |
| 2018/0217059 A1 | 8/2018 | Barbi et al. | |
| 2022/0068597 A1* | 3/2022 | Yamamoto | H01J 37/28 |

FOREIGN PATENT DOCUMENTS

| | | | |
|---|---|---|---|
| JP | 2013541799 A | 11/2013 | |
| JP | 2018529210 A | 10/2018 | |
| WO | 2014097857 A1 | 6/2014 | |

OTHER PUBLICATIONS

Written Opinion dated Mar. 19, 2019 in corresponding International Application No. PCT/JP2018/046514.

* cited by examiner

[FIG. 1]
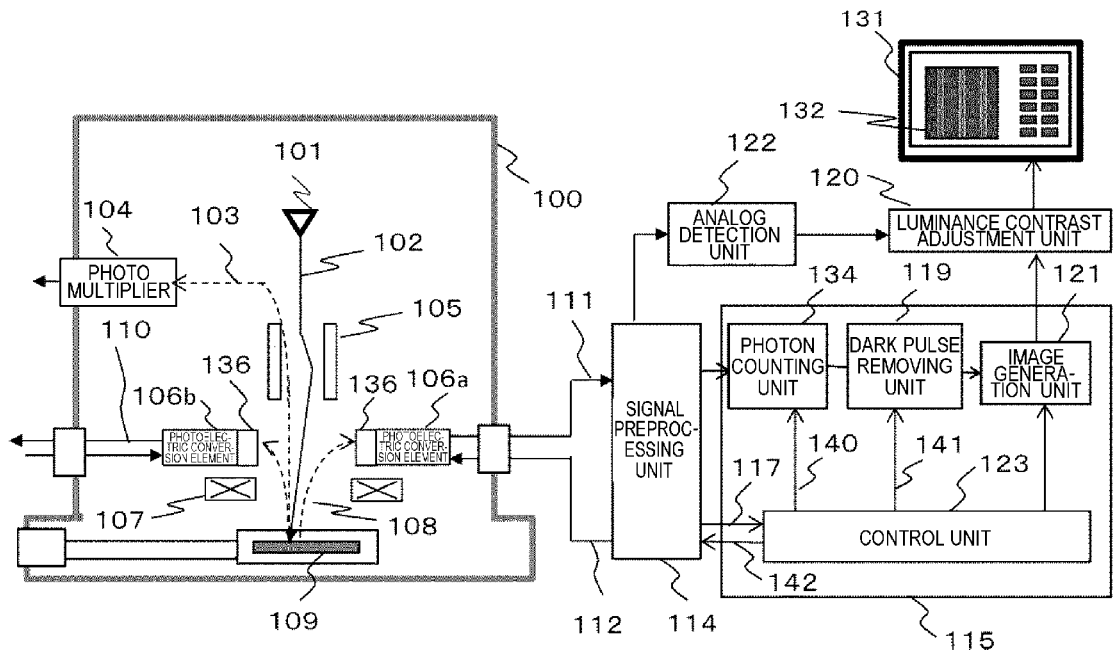
[FIG. 2]
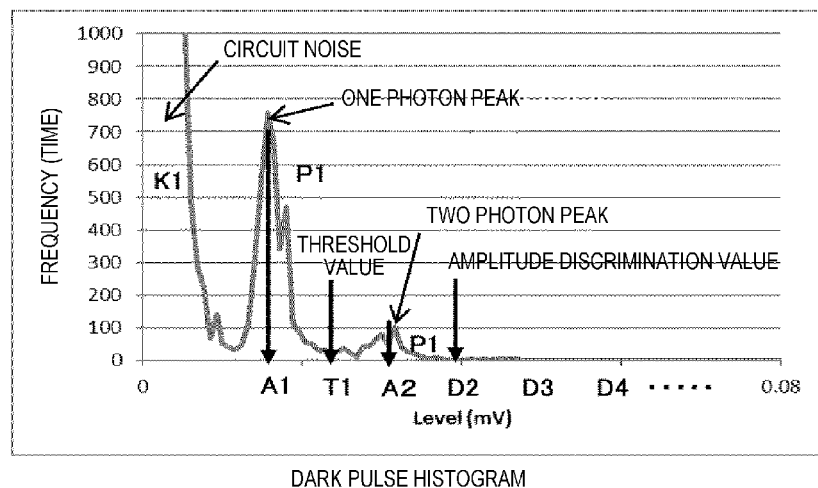
DARK PULSE HISTOGRAM

[FIG. 3A]
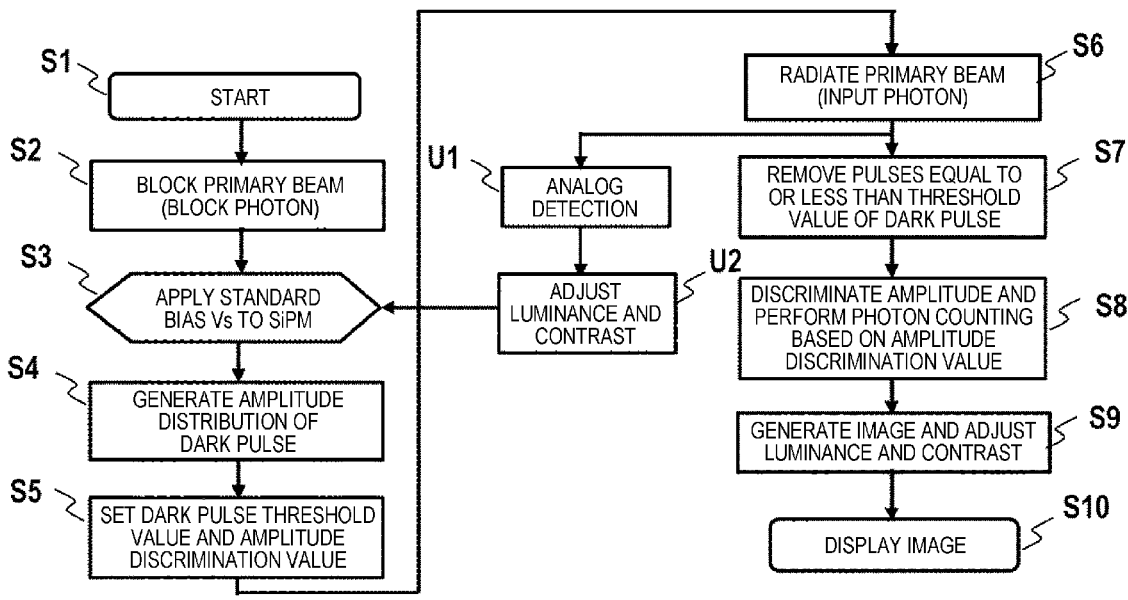
[FIG. 3B]
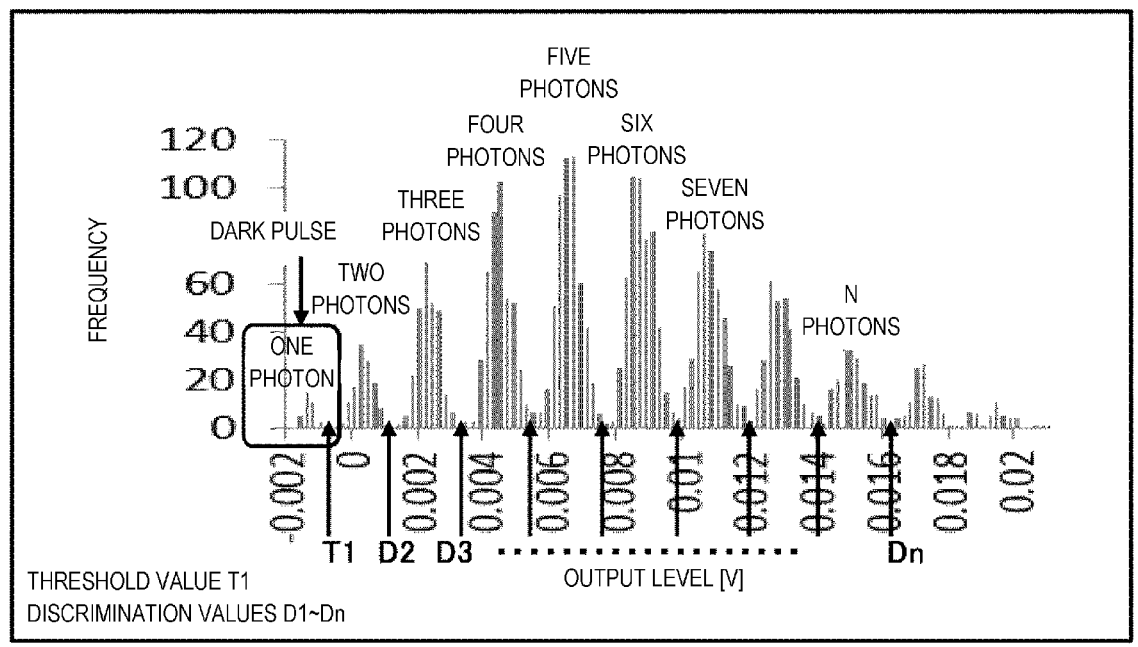

[FIG. 4]
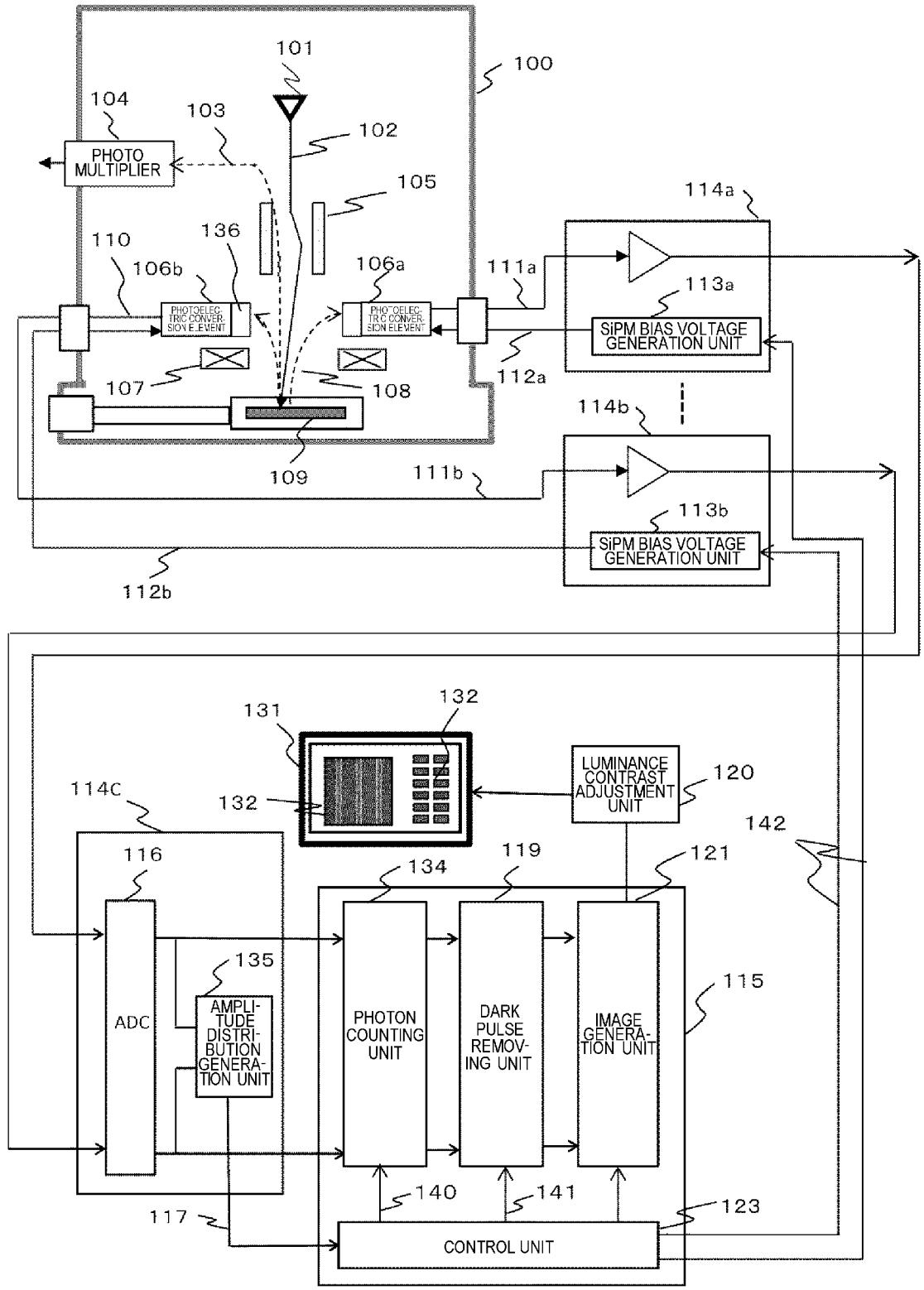

[FIG. 5A]
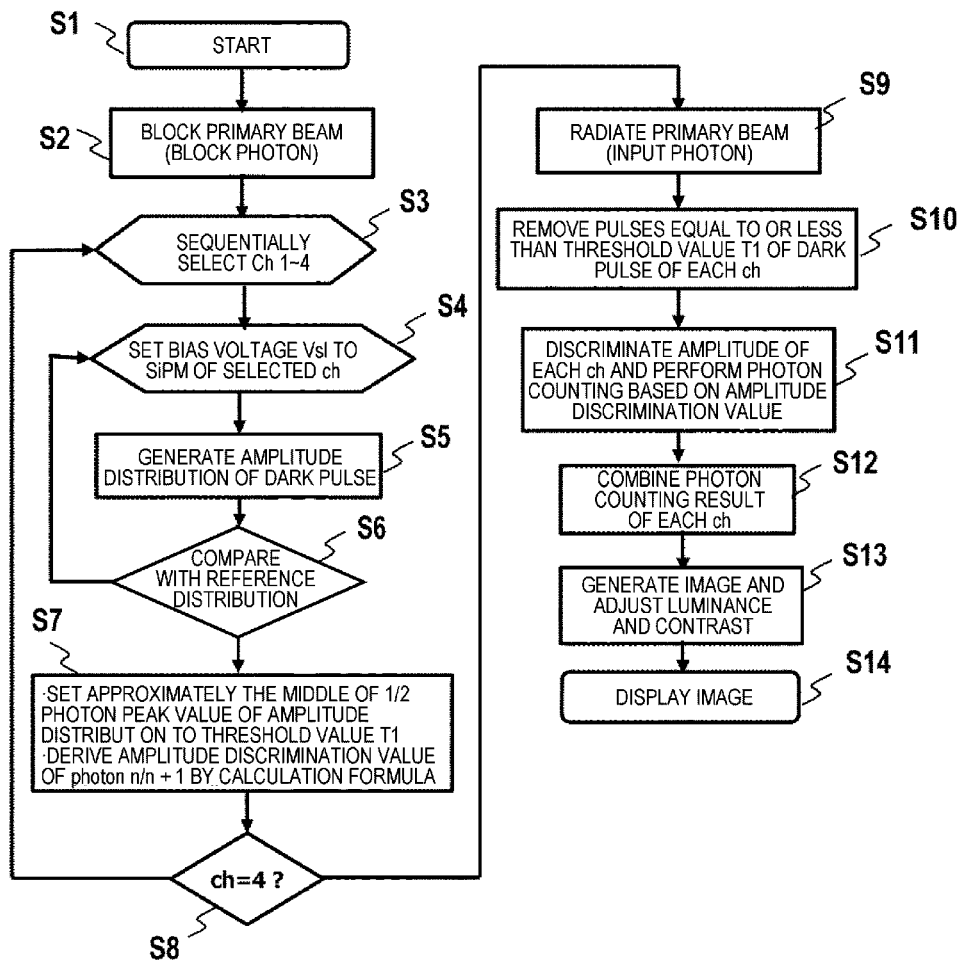
[FIG. 5B]
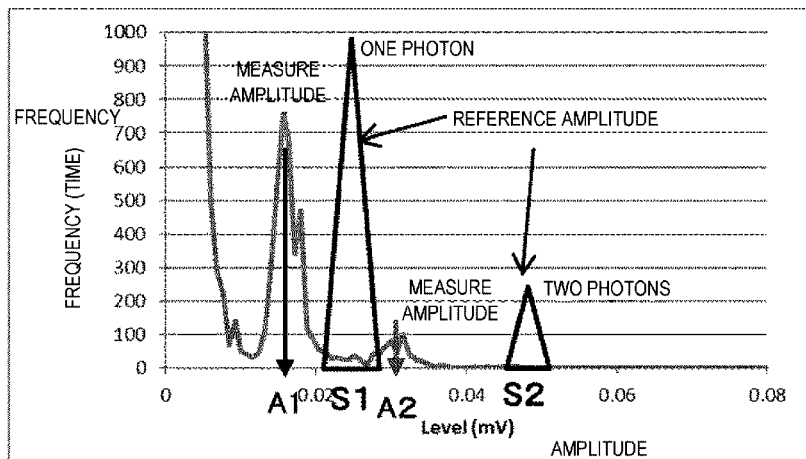

[FIG. 6]
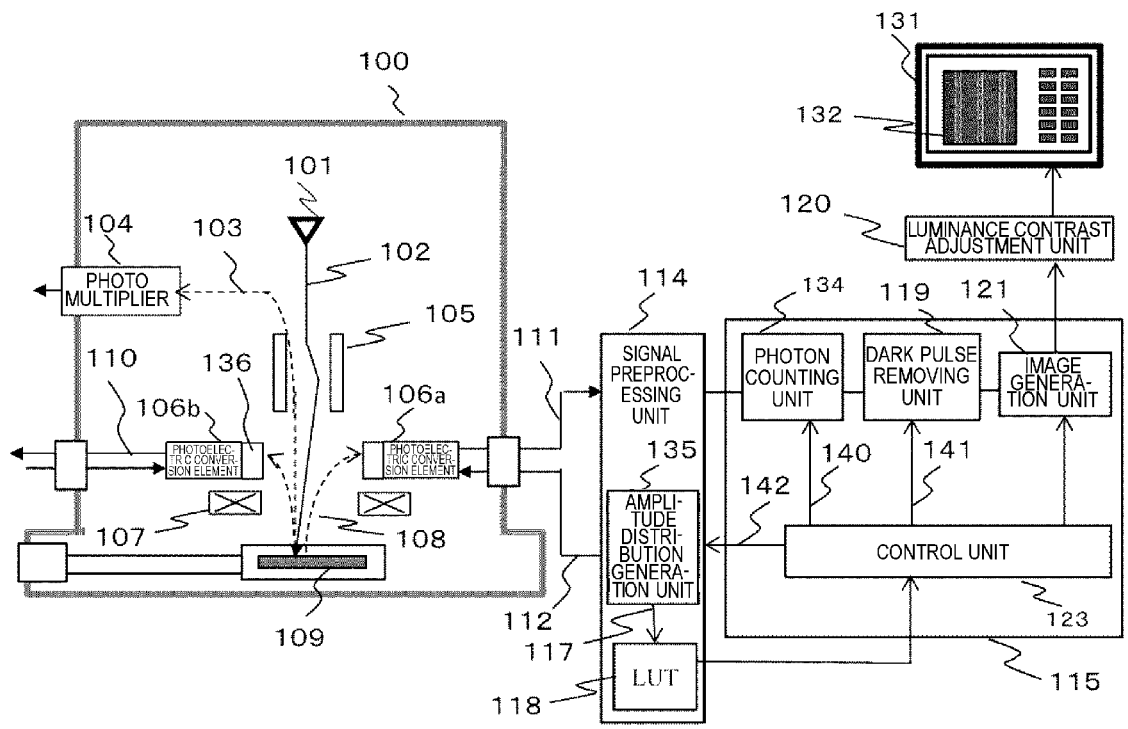
[FIG. 7]
| | | | | | |
|---|---|---|---|---|---|
| CONTROL VOLTAGE | 55 | .. | 60 | .. | 65 |
| ONE PHOTON PEAK LEVEL A1 (V) | 0.007 | | 0.016 | | 0.026 |
| TWO PHOTON PEAK LEVEL A2 (V) | 0.014 | | 0.032 | | 0.056 |
| THRESHOLD VALUE (WITHIN 1/2 photon) | (A1 + A2) / 2 | | | | |
| AMPLITUDE DISCRIMINATION VALUE (WITHIN PHOTON n/n + 1) | {A1*(3-2n) + A2*(2n-1)} / 2 | | | | |

[FIG. 8]
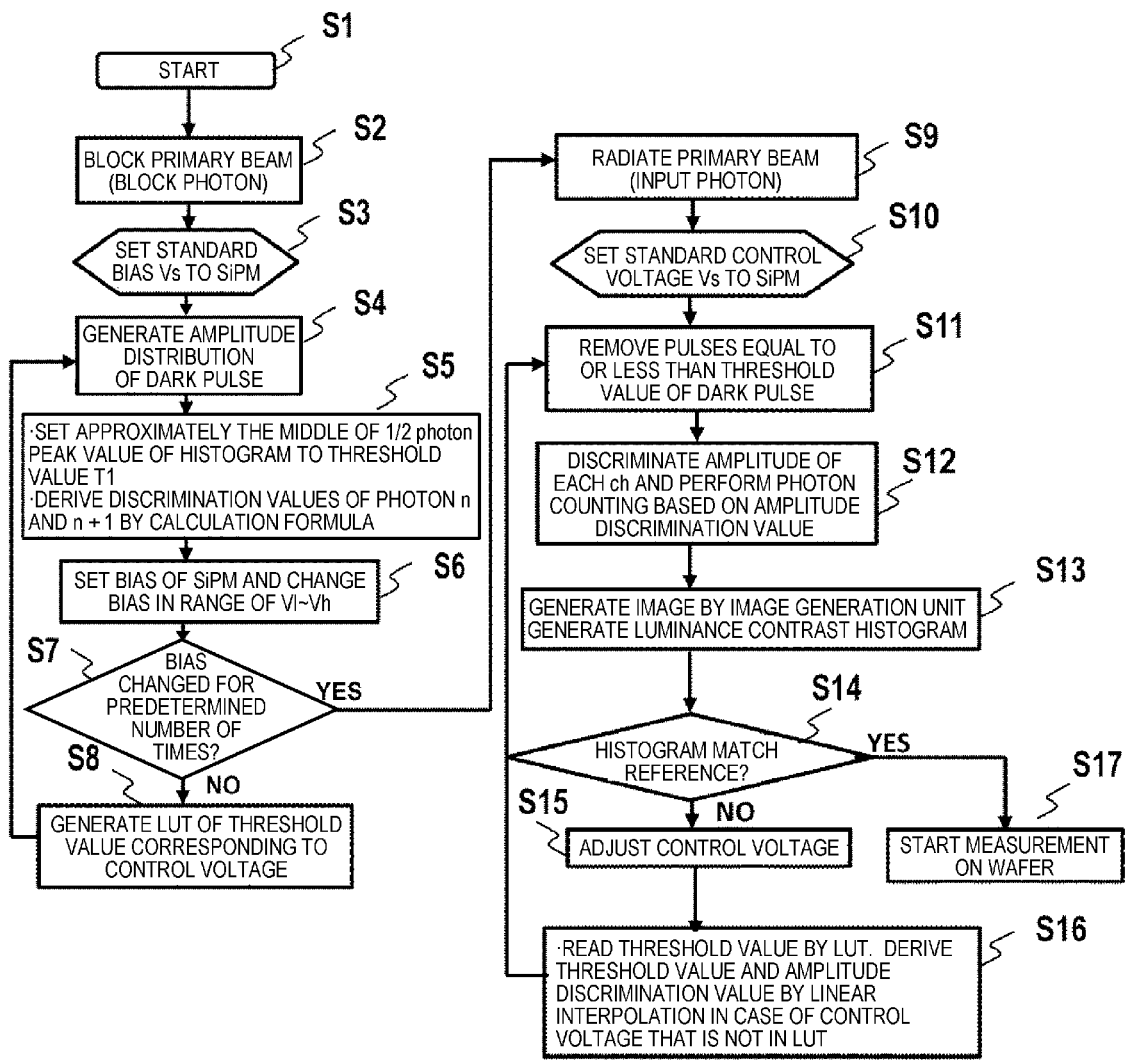

MEASUREMENT DEVICE AND SIGNAL PROCESSING METHOD

TECHNICAL FIELD

The present invention relates to a measurement device, and more specifically, relates to a signal processing technique of a charged particle beam device (which is a kind of measurement device) which radiates a charged particle beam, detects generated second charged particles, etc. to obtain an image, thereby performing measurement.

BACKGROUND ART

A charged particle beam device such as a scanning electron microscope or a mass analysis device is used as a device for evaluating and measuring a semiconductor device. In recent years, a structure of the semiconductor device is miniaturized and three-dimensionally processed, and evaluation values required by customers who are semiconductor device manufacturers are diversifying. In particular, with the three-dimensionally processing of the device structure, there is a need to measure a bottom dimension of a hole or a groove shape on a semiconductor substrate with high accuracy in order to improve yield.

In the above-mentioned measurement using the scanning electron microscope, when a sample is irradiated with a primary electron beam, signal electrons having various energies are emitted in various directions due to interaction between the electrons and the sample. The signal electrons as second charged particles have different information about the sample depending on emission energies and emission angles, and discrimination detection of the signal electrons is indispensable for various measurements.

In general, signal electrons are distinguished such that signal electrons emitted with energy of 50 eV or less are called secondary electrons, signal electrons emitted with energy larger than 50 eV and close to the energy of the primary electron beam are called backscattered electrons. The secondary electrons are sensitive to a surface shape or electrical potential of the sample, and are effective for measuring a dimension of a surface structure such as a pattern width of a semiconductor device structure. For three-dimensional structures such as a hole and a groove, the secondary electrons cannot escape from the hole or the groove because they are absorbed by side walls and detection and measurement cannot be performed. On the other hand, as disclosed in Patent Literature 1, reflected electrons contain information on a composition and a three-dimensional shape of a sample, and information on a three-dimensional structure, differences in compositions between a surface and a bottom, and the like, can be obtained. Since the reflected electrons have high energy, the reflected electrons can escape from a hole and a groove through side walls and signals from the bottom of the hole and the groove structure can be detected and measured. Patent Literature 1 discloses an example in which a semiconductor element such as a silicon photomultiplier (hereinafter, referred to as SiPM) is used for detecting the reflected electrons.

CITATION LIST

Patent Literature

PTL 1: JP-A-2013-541799

SUMMARY OF INVENTION

Technical Problem

As described above, in a charged particle beam device, a semiconductor element such as a photodiode or SiPM capable of supplementing reflected electrons near a sample and a photoelectric conversion element such as a photomultiplier are suitable for high-precision shape measurement. In particular, the SiPM is characterized in that a detected signal amplitude changes linearly in proportion to the number of inputted photons, and photon counting by amplitude discrimination is possible. The SiPM outputs a current corresponding to the number of photons of incident light by combining a plurality of avalanche photodiodes (APDs) of a basic element in an array and applying a bias voltage to enter a geiger mode.

When the photons are emitted on a plurality of pixels at such a SiPM at almost the same time, outputted pulses are superposed according to the number of photons and the amplitude is large. In addition, the SiPM produces a dark pulse due to a thermally generated dark current carrier that degrades S/N even when there is no incident photon, and most amplitude values are equivalent to the amplitude of the current generated when one photon is inputted to the APDs. Therefore, in order to improve the S/N of an outputted signal of the SiPM and obtain a good SEM image, it is necessary to process the outputted pulses in consideration of these SiPM characteristics. In addition, since a large number of SiPMs are arranged in the device to improve the SN, it is necessary to consider variation between SiPM elements and DC offset of a detection circuit.

An object of the invention is to provide a charged particle beam device and a signal processing method that solve the above-mentioned problems and enable highly accurate measurement. Other objects will become apparent in the description of embodiments.

Solution to Problem

In order to achieve the above-mentioned object, the invention provides a measurement device that includes: a photoelectric conversion element; and a signal processing unit configured to receive from the photoelectric conversion element a detected pulse including a dark pulse and a signal pulse that is outputted in response to an inputted photon. The signal processing unit discriminates amplitude of the detected pulse based on amplitude distribution of the dark pulse of the photoelectric conversion element acquired in advance. An example of the measurement device is a charged particle beam device.

In addition, in order to achieve the above-mentioned object, the invention provides a signal processing method including: acquiring in advance amplitude distribution of a dark pulse of a photoelectric conversion element installed in a device; receiving from the photoelectric conversion element a detected pulse including a dark pulse and a signal pulse that is outputted in response to an inputted photon; and discriminating amplitude of the received detected pulse based on the amplitude distribution of the dark pulse.

Advantageous Effect

According to the invention, highly accurate measurement is possible by setting a threshold value and an amplitude discrimination value using the amplitude distribution of a dark pulse.

BRIEF DESCRIPTION OF DRAWINGS

FIG. 1 is a schematic view of a scanning electron microscope according to a first embodiment.

FIG. 2 is a diagram showing an example of a dark pulse histogram according to the first embodiment.

FIG. 3A is a diagram showing an operation flowchart of the scanning electron microscope according to the first embodiment.

FIG. 3B is a diagram showing an example of photon distribution at the time of measurement by the scanning electron microscope according to the first embodiment.

FIG. 4 is a schematic view of a scanning electron microscope according to a second embodiment.

FIG. 5A is a diagram showing an operation flowchart of the scanning electron microscope according to the second embodiment.

FIG. 5B is a diagram showing an example of amplitude distribution of a dark pulse at a certain time according to the second embodiment.

FIG. 6 is a schematic view of a scanning electron microscope according to a third embodiment.

FIG. 7 is a diagram showing an example of a table of a threshold value and an amplitude discrimination value according to the third embodiment.

FIG. 8 is a diagram showing an operation flowchart of the scanning electron microscope according to the third embodiment.

DESCRIPTION OF EMBODIMENTS

The following embodiments describe a case where the invention is particularly applied to a scanning electron microscope which is a charged particle beam device, and the invention is not limited to the scanning electron microscope and also can be applied to other charged particle beam devices.

First Embodiment

The first embodiment is an embodiment of a scanning electron microscope that includes a photoelectric conversion element and a signal processing unit configured to receive from the photoelectric conversion element a detected pulse including a dark pulse and a signal pulse that is outputted in response to an inputted photon. The signal processing unit discriminates amplitude of the detected pulse based on amplitude distribution of the dark pulse of the photoelectric conversion element acquired in advance.

The first embodiment is an embodiment of a signal processing method including acquiring in advance amplitude distribution of a dark pulse of a photoelectric conversion element installed in a scanning electron microscope, receiving from the photoelectric conversion element a detected pulse including the dark pulse and a signal pulse that is outputted in response to an inputted photon, and discriminating amplitude of the received detected pulse based on the amplitude distribution of the dark pulse.

The configuration and operation of the first embodiment will be described with reference to FIGS. 1, 2, 3A, and 3B. FIG. shows a configuration example of the scanning electron microscope of the first embodiment. An electron gun 101 is disposed inside an electron microscope column 100 which is in a vacuum environment. A primary electron beam 102 emitted from the electron gun 101 flies along a primary electron beam optical axis. A trajectory of the primary electron beam 102 is adjusted by a deflector 105 and is converged on a sample 109 by an objective lens 107. In addition, the material 109 is placed on a stage provided in the electron microscope. A negative voltage is applied to the sample 109, and the primary electron 102 collides with the sample 109 with energy smaller than energy generated by the electron gun 101. Reflected electrons 108 and secondary electrons 103 generated from the sample due to the collision of the primary electron 102 fly in the electron microscope column 100 according to respective emission energies and emission angles.

When the reflected electrons 108 collide with a scintillator 136, the reflected electrons 108 are converted into light. The light is converted into a detection current by a semiconductor element such as a photodiode or SiPM, or a photoelectric conversion element 106a such as a photomultiplier, and becomes a detected signal 111. The detected signal 111 is transmitted from an in-vacuum wiring 110 through hermetic to a signal processing unit 115 via a signal preprocessing unit 114. As will be described later, the signal preprocessing unit 114 generates amplitude distribution 117 and a bias voltage 112 of the photoelectric conversion element 106a based on a dark pulse in a certain period of time. The dark pulse is a pulse generated by multiplying a thermally generated dark current carrier.

The signal processing unit 115 includes a dark pulse removing unit 119, an image generation unit 121, a photon counting unit 134, and a control unit 123. The detected signal 111 at the time of measurement is converted into a digital signal by an analog-to-digital converter (ADC) in the signal preprocessing unit 114 and is inputted to the signal processing unit 115. The signal processing unit 115 can be implemented by executing a program of a central processing unit (CPU).

The photon counting unit 134 of the signal processing unit 115 discriminates signal amplitude of the detected signal 111 digitized based on an amplitude discrimination value 140 from the control unit 123 and counts the number of photons. In addition, the dark pulse removing unit 119 removes a dark pulse of the detected signal 111 based on a threshold value 141 from the control unit 123. The image generation unit 121 generates an image based on the detected signal 111. The image from the image generation unit 121 is adjusted by a luminance contrast adjustment unit 120 and then displayed as a measurement observation inspection image on a user interface 132 of a display unit of a computer 131. In the present description, the signal preprocessing unit 114 that acquires amplitude distribution of the dark pulse in advance and the signal processing unit 115 may be collectively referred to as a signal processing unit. An analog detection unit 122 will be described later.

A procedure for measuring reflected electrons in the scanning electron microscope shown in FIG. 1 will be described with reference to the dark pulse histogram of FIG. 2, the operation flowchart of FIG. 3A, and the photon distribution example at the time of measurement of FIG. 3B.

When an operation is started in the flow of FIG. 3A (S1), the primary electron beam 102 is blocked to block the photons (S2), and a standard bias voltage (Vs) 112 is applied to the photoelectric conversion element 106a (S3). The dark pulse is outputted from the photoelectric conversion element 106a by applying the bias. Based on the outputted dark pulse, the amplitude distribution of the dark pulse at a certain time as shown in FIG. 2, that is, the dark pulse histogram is generated (S4). A horizontal axis of the dark pulse histogram shows a dark pulse level (mV), and a vertical axis shows a frequency (times).

As shown in FIG. 2, by the observation of the amplitude distribution of the dark pulse at a certain time, at least a peak P1 of pulse amplitude corresponding to one photon input, a peak P2 of pulse amplitude corresponding to two photon input, and a peak K1 of circuit noise generated in the signal preprocessing unit 114 are observed in the amplitude distribution. The control unit 123 of the signal processing unit 115 receives the amplitude distribution 117 from the signal preprocessing unit 114, and sets the threshold value (T1) 141 for one dark pulse and a plurality of amplitude discrimination values (Dn) 140 (S5). In the present embodiment, the threshold value 141 is set by T1=(A1+A2)/2 from the peak A1 of P1 and the peak A2 of P2. In addition, the amplitude discrimination value 140 is calculated by the amplitude discrimination values Dn={A1×(3−2n)+A2×(2n−1)}/2 (n≥2) of peaks of n photons and peaks of (n+1) photons. In addition, the control unit 123 generates a control signal 142 for controlling the bias voltage 112 of the photoelectric conversion element 106a, and outputs the control signal 142 to the signal preprocessing unit 114.

Next, a primary beam at the time of actual measurement is radiated by the scanning electron microscope, and a photon having information on an object to be measured such as a semiconductor wafer is inputted to the photoelectric conversion element 106a (S6). An example of the photon distribution at the time of measurement is shown in FIG. 3B.

In the photon distribution shown in FIG. 3B, the dark pulse removing unit 119 removes pulses equal to or less than the dark pulse based on the previously calculated threshold value T1 (S7). In addition, the photon counting unit 134 discriminates the amplitude of the detected pulse, and performs photon counting of how many photons the detected pulse corresponds to based on the previously calculated amplitude discrimination values D1 to Dn (S8). Further, the image generation unit 121 generates an image based on a photon counting value, and adjusts luminance and contrast of the generated image by program processing (S9). This adjustment can be performed by digital signal processing so that luminance contrast distribution of the obtained image matches reference luminance contrast distribution generated and stored in advance. After that, the adjusted image is displayed on the user interface 132 on a screen of the computer 131 (S10). The computer 131 may execute functions of the luminance contrast adjustment unit 120 and further the signal processing unit 115.

As described above, an operation main body of the operation flow described with reference to FIG. 3A is the signal preprocessing unit 114 including an amplitude distribution generation unit and the signal processing unit 115 including the control unit 123. When this operation flow is executed by the digital signal processing by a program, the program can be stored in, for example, a storage medium in the control unit 123, a storage unit in the computer 131, or a storage device of a server of an external network to which the computer 131 is connected.

In addition, the luminance contrast adjustment of the image may be performed by using the output of the analog detection unit 122 to which an analog detected signal 111 is inputted, in addition to the digital luminance contrast adjustment described above. In this case, after sequence S6, the analog detection unit 122 performs analog detection at the standard bias voltage Vs (U1), and the luminance contrast distribution is created from a detection result. The luminance contrast distribution is compared with a reference luminance contrast distribution so that the luminance and contrast are adjusted (U2). That is, the luminance contrast adjustment is performed by returning to the sequence S3 to coincide the luminance contrast distribution with the reference luminance contrast distribution, and adjusting the bias voltage 112 from Vs to Vt, and then the sequences S6, S7, S8, and S10 described above are performed.

In addition, the invention is not limited to the operation procedure described above, and may be performed as follows: S6→U1→U2→S2→S3→S4→S5→S6→S7→S8→S10 after the start (S1) of the flow in FIG. 3A.

According to the first embodiment described above, the amplitude distribution of the dark pulse is measured in a state where no photon is inputted, and the threshold value and the amplitude discrimination value are set to obtain a stable threshold value and a stable amplitude discrimination value regardless of an object to be measured. The SN of the generated image can be improved by removing the dark pulse. In addition, the SN of the generated image can be improved by performing the photon counting on the pulse output amplitude outputted from the photoelectric conversion element based on the amplitude discrimination value.

Second Embodiment

The configuration and operation of a scanning electron microscope provided with a plurality of ch of photoelectric conversion elements of the second embodiment will be described with reference to FIGS. 4, 5A, and 5B. FIG. 4 shows a general schematic configuration of the scanning electron microscope of the present embodiment. The same components as those in FIG. 1 for describing the first embodiment will be omitted.

The present embodiment is an embodiment in which a plurality of photoelectric conversion elements 106, that is, four photoelectric conversion elements are used (note that only two of the photoelectric conversion elements 106a/b are shown in an illustrated relation). Four signal preprocessing units 114a/b and four bias voltage generation units 113a/b are also provided in the present embodiment. For the illustrated relation, FIG. 4 shows two systems, respectively. However, the invention is not limited to two systems, and a number of systems corresponding to the number of photoelectric conversion elements 106 are installed. The output corresponding to detected signals 111a/b is inputted from signal preprocessing units 114a/b to a signal preprocessing unit 114c. The signal preprocessing unit 114c includes an ADC 116 and an amplitude distribution generation unit 135.

The amplitude distribution generation unit 135 of the signal preprocessing unit 114c is a block that generates the amplitude distribution 117 of the dark pulse at a certain time in advance, and outputs the generated amplitude distribution 117 to the control unit 123 of the signal processing unit 115. The control unit 123 compares the amplitude distribution 117 with stored reference distribution, and outputs the control signal 142 for controlling a bias voltage 112a/b generated by a SiPM bias generation unit 113a/b.

The detected signals 111a and 111b converted into digital signals by the ADC 116 are inputted to the signal processing unit 115. The photon counting unit 134, the dark pulse removing unit 119, an image generation block 121, and the control unit 123 of the signal processing unit 115 also have a function of processing each of the detected signals 111a/b of the plurality of photoelectric conversion elements 106a/b. In the configuration of the present embodiment, the amplitude distribution generation unit 135 and the signal processing unit 115 installed behind the ADC 116 can be implemented by executing a program of a CPU as in the first embodiment.

The operation of the scanning electron microscope provided with the plurality of ch of photoelectric conversion elements shown in FIG. 4 will be described in detail using the flowchart of FIG. 5A. The primary electron beam 102 is blocked (S2), and one of the plurality of photoelectric conversion elements 106 is selected (S3). Here, as an example, four systems (four channels, hereinafter, referred to as ch) of photoelectric conversion elements 106 are provided, but the invention is not limited thereto.

First, ch 1 is selected, and the standard bias voltage (Vs) 112 is applied to the selected ch of the plurality of photoelectric conversion elements 106 (S4). The dark pulse is outputted from the selected ch of the plurality of photoelectric conversion elements 106 by applying a bias, and the amplitude distribution of the dark pulse at a certain time as shown in FIG. is generated (S5). By the observation of the amplitude distribution at a certain time, at least the peak P1 of pulse amplitude corresponding to one photon input, the peak P2 of pulse amplitude corresponding to two photon input, and the peak K1 of circuit noise generated in the signal preprocessing unit 114 are observed in the amplitude distribution 117. This amplitude distribution is compared with peak positions S1 and S2 of one photon and two photons of the reference amplitude distribution shown in FIG. 5B, and the bias voltage 112 is adjusted so that an amplitude difference (A2−A1=S2−S1) between the peak positions is equal (S4).

Here, a reason why the bias voltage 112 is not adjusted so that A1=S1 or A2=S2 is that, an error due to the DC offset occurs in the threshold value T1 and the amplitude discrimination value Dn when the bias voltage 112 is adjusted so that A1=S1 or A2=S2 because the signal preprocessing unit 114 that processes the outputted pulse of each ch has the DC offset due to element variation and temperature characteristics. In addition, the bias voltage 112 may be adjusted so that A1=S1 or A2=S2 if a function is provided to remove the DC offset generated by the signal preprocessing unit 114 or the like in advance. If the dark pulse distribution matches the reference distribution, the threshold value T1 and the amplitude discrimination value Dn are set by the threshold value 141 from the peak A1 of P1 and the peak A2 of P2 by $T1=(A1+A2)/2$. In addition, the amplitude discrimination value 140 can be calculated by the amplitude discrimination value $Dn=\{A1\times(3-2n)+A2\times(2n-1)\}/2$ ($n\geq 2$) of peaks of n photons and peaks of (n+1) photons (S7). The above sequence of S3 to S7 is performed for each of the four ch, and the threshold value and the amplitude discrimination value of each of the four ch are obtained, respectively (S8).

Next, the primary beam 102 for actual measurement is radiated by the scanning electron microscope, and a photon having information on the sample 109, which is an object to be measured such as a semiconductor wafer, is inputted to each ch of the plurality of photoelectric conversion elements 106 (S9). An example of photon distribution of each ch at the time of measurement is as shown in FIG. 3B. In this distribution, pulses equal to or less than the dark pulse are removed based on the threshold value T1 shown above (S10), the amplitude of the detected pulse is discriminated based on the amplitude discrimination value Dn, and the photon counting of how many photons the detected pulse corresponds to is performed (S11). After that, photon counting results of each ch are combined (S12), the image generation unit 121 generates an image, adjusts the luminance and contrast (S13), and displays the image (S14). In addition, also in the present embodiment, the luminance contrast adjustment may be performed by using the analog detection unit 122 provided on each ch as in the first embodiment.

According to the present embodiment, since the threshold value T1 and the amplitude discrimination value Dn of each ch of the plurality of photoelectric conversion elements 106 are obtained by using the reference amplitude distribution, there is an effect that the variation of the each ch of the plurality of photoelectric conversion elements 106, the variation of the signal preprocessing unit 114, and the DC offset are not affected. In addition, it is possible to obtain a stable threshold value and a stable amplitude discrimination value regardless of the object to be measured by setting the threshold value and the amplitude discrimination value using the dark pulse. The SN of the generated image can be improved by removing the dark pulse. In addition, the SN of the generated image can be improved by performing the photon counting on the pulse output amplitude outputted from the plurality of photoelectric conversion elements based on the amplitude discrimination value. In addition, by adjusting the bias voltage of each element so that the dark pulse distribution of each of the plurality of arranged SiPM elements matches the reference value, it is possible to reduce the influence of the variation between the elements and the DC offset of a detected signal processing circuit.

Third Embodiment

The configuration and operation of a scanning electron microscope using a table (LUT) of the third embodiment will be described with reference to FIGS. 6 to 8. FIG. 6 is a diagram showing a schematic configuration of the scanning electron microscope of the present embodiment. The same configuration units as those in FIG. 1 for describing the first embodiment will be omitted.

The signal preprocessing unit 114 according to the present embodiment sets the bias voltage 112 from the SiPM bias generation unit as described in FIG. 4 to a plurality of voltages, generates the amplitude distribution 117 of the dark pulse at each bias voltage 112, and creates an LUT 118 of the threshold value 141 and the amplitude discrimination value 140 based on the amplitude distribution 117. In the present embodiment, the amplitude distribution generation unit 135, the LUT 118, and the signal processing unit 115 can be implemented by executing a program of a CPU as in the first and the second embodiments. FIG. 7 shows a configuration example of the LUT 118.

First, the operation procedure of the scanning electron microscope of the third embodiment will be described in detail with reference to the flowchart of FIG. 8. First, the primary electron beam 102 is blocked (S2), and the standard bias voltage (Vs) 112 is applied to the plurality of photoelectric conversion elements 106 (S3). The dark pulse is outputted from the plurality of photoelectric conversion elements 106 by applying the bias, and amplitude distribution of the dark pulse at a certain time as shown in FIG. 2 is generated (S4). By the observation of the amplitude distribution at a certain time, at least the peak P1 of pulse amplitude corresponding to one photon input, the peak P2 of pulse amplitude corresponding to two photon input, and the peak K1 of circuit noise generated in the signal preprocessing unit 114 are observed in the amplitude distribution. From these amplitude distributions, the threshold value (T1) 141 of the dark pulse and the amplitude discrimination value (Dn) 140 are set (S5). Here, the threshold value 141 is set by $T1=(A1+A2)/2$ from the peak A1 of P1 and the peak A2 of P2. In addition, the amplitude discrimination value 140 can be calculated by the amplitude discrimination value $D_n=\{A1\times(3-2n)+A2\times(2n-1)\}/2$ ($n\geq 2$) of peaks of n photons and peaks of (n+1) photons.

Next, the bias voltage 112 of SiPM is changed in a range of V1 to Vs to Vh (S6). After the change, the process is returned to sequence S4 to generate the amplitude distribution 117. The threshold value and the amplitude discrimination value are calculated in S5, and the bias voltage 112 is further changed in S6. After that, in sequence S8, the LUT 118 of the threshold value and the amplitude discrimination value for the bias voltage 112 is created.

FIG. 7 shows a configuration example of the LUT 118. As shown in the same figure, when the bias voltage 112 is changed a predetermined number of times (S7), one photon peak level A1 (V) and two photon peak level A2 (V) are stored corresponding to a plurality of control voltages (bias voltages 55 to 65), and the threshold value and the amplitude discrimination value corresponding to the respective bias voltages can be obtained (S8).

Next, the primary beam 102 at the time of the actual measurement is radiated by the scanning electron microscope in the present embodiment, photons having information on the sample 109, which is an object to be measured such as a semiconductor wafer, are inputted to the plurality of photoelectric conversion elements 106 (S9), and the bias voltages of the photoelectric conversion elements 106 are set to the standard voltage Vs (S10). An example of photon distribution during measurement as shown in FIG. 3 is obtained. In this distribution, pulses equal to or less than the dark pulse are removed based on the threshold value T1 determined according to stored contents of the LUT 118 (S11), the amplitude of the detected pulse is discriminated based on the amplitude discrimination value Dn, and the photon counting of how many photons the detected pulse corresponds to is performed for each ch (S12).

After that, an image is generated and the luminance and contrast are adjusted (S13). In this adjustment, it is determined whether the luminance contrast distribution of the generated image matches the reference luminance contrast (S14). When the luminance contrast distribution of the generated image does not match the reference luminance contrast, the bias voltage 112 is adjusted by the control signal from the control unit 123 (S15), the threshold value and the amplitude discrimination value corresponding to the adjusted bias voltage 112 are derived from the LUT 118 (S16), and the flow is sequentially performed from the sequence S11 again. In a case of bias voltages that are not in the LUT 118, the threshold value and the amplitude discrimination value may be derived by linear interpolation or the like. When luminance histogram distributions match (Yes) in S14, wafer measurement is started (S17).

According to the present embodiment, by creating the table of the threshold value and the amplitude discrimination value in advance using the dark pulse, the threshold value when the value of the bias voltage is changed can be easily read out. By using the table, for example, the luminance histogram can be easily adjusted. In addition, if the table of the threshold value and the amplitude discrimination value is prepared for different temperature of the plurality of photoelectric conversion elements 106, stable measurement can be performed by resetting the threshold value and the amplitude discrimination value using this table when the plurality of photoelectric conversion elements 160 or the signal preprocessing unit 114 changes depending on the temperature.

The invention is not limited to the above-described embodiments, and includes various modified embodiments. For example, the above-mentioned embodiments have been described in detail for better understanding of the invention, and are not necessarily limited to those having all the configurations of the description. In the first to third embodiments, examples in which the invention is applied to a charged particle beam device represented by a scanning electron microscope have been described, but the invention is not limited to the examples. For example, the invention can be applied to a plurality of photoelectric conversion elements used in an inspection device that radiates or uses an X-ray (electromagnetic wave in a broad sense) such as a CT device or a PET device that is an example of a measurement device. As a matter of course, these measurement devices include apart or all of the above-described embodiments such as an irradiation unit (corresponding to the electron gun 101 of the above-mentioned embodiments) that radiates the X-ray (electromagnetic wave in a broad sense), and a stage for placing a target to be measured or a person to be measured (corresponding to the sample 109 of the above-mentioned embodiments).

In addition, the signal preprocessing unit 114 may include a CPU in addition to the ADC described above, and may execute a program to implement the "unit" described above. In addition, the analog detection unit 122 and the luminance contrast adjustment unit 120 may be implemented by a computer having a CPU. In addition, the signal preprocessing unit 114, the signal processing unit 115, the analog detection unit 112, the luminance contrast adjustment unit 120, and the computer 131 (hereinafter, they may be collectively referred to as a processing subsystem. However, as described above, the processing subsystem does not necessarily include all of them.) may be mounted on the same substrate or be mounted separately on a plurality of substrates. In addition, it goes without saying that each constituent element having a CPU may have a memory.

Further, although an example of creating a program that implements a part or all of the configurations, functions, and computers described above is mainly described, it is needless to say that a part or all of them may be implemented by hardware, for example, by designing an integrated circuit. In other words, all or a part of the functions of the signal processing unit may be implemented by, for example, an integrated circuit such as an Application Specific Integrated Circuit (ASIC) or a Field Programmable Gate Array (FPGA) instead of the program.

REFERENCE SIGN LIST 100 electron microscope column
101 electron gun
102 primary electron
105 deflector
106, 106a, 106b photoelectric conversion element
107 objective lens
108 reflected electron
109 sample
110 in-vacuum wiring
111 detected signal
112 bias voltage
114, 114a, 114b, 114c signal preprocessing unit
115 signal processing unit
116 analog-to-digital converter (ADC)
117 amplitude discrimination
119 dark pulse removing unit
121 image generation block
120 luminance contrast adjustment unit
131 computer 123 control unit
132 user interface
133 measurement observation inspection image
134 photon counting unit
135 amplitude distribution generation unit
118 table (LUT)
140 amplitude discrimination value
141 threshold value
142 control signal

The invention claimed is:

1. A signal processing method comprising:
acquiring in advance amplitude distribution of a dark pulse of a photoelectric conversion element installed in a device;
receiving, from the photoelectric conversion element, a detected pulse including the dark pulse and a signal pulse that is outputted in response to an inputted photon;
discriminating amplitude of the received detected pulse based on the amplitude distribution of the dark pulse; and
acquiring the amplitude distribution of the dark pulse in a state where no light is incident on the photoelectric conversion element.

2. The signal processing method according to claim 1, further comprising:
setting a dark pulse threshold value; and
removing the dark pulse included in the detected pulse based on the amplitude distribution of the dark pulse.

3. The signal processing method according to claim 2, further comprising:
setting an amplitude discrimination value of the detected pulse based on the amplitude distribution of the dark pulse.

4. The signal processing method according to claim 3, further comprising:
setting the dark pulse threshold value T1 as $(A1+A2)/2$, and setting the amplitude discrimination value Dn between n photons and n+1 photons to substantially $Dn=\{A1\times(3-2n)+A2\times(2n-1)\}/2$ $(n \geq 2)$ based on an amplitude A1 corresponding to one photon of the dark pulse and an amplitude A2 corresponding to two photons in the amplitude distribution of the dark pulse.

* * * * *